United States Patent
Thoener

[11] 3,999,123
[45] Dec. 21, 1976

[54] DIGITAL VOLTAGE LEVEL MEASURING DEVICE

[75] Inventor: Gerhard Thoener, Deisenhofen, Germany

[73] Assignee: Siemens Aktiengesellschaft, Berlin & Munich, Germany

[22] Filed: Feb. 13, 1975

[21] Appl. No.: 549,657

[30] Foreign Application Priority Data

Feb. 19, 1974 Germany ............... 2407968

[52] U.S. Cl. .................. 324/99 D; 324/111; 324/132; 340/347 NT
[51] Int. Cl.$^2$ ............. G01R 17/06; H03K 13/02; G01R 15/10
[58] Field of Search ........... 324/99 D, 111, 132; 340/347 AD, 347 NT; 328/145

[56] References Cited
UNITED STATES PATENTS 3,566,265  2/1971  Reid ................... 324/99 D

*Primary Examiner*—Robert Segal
*Assistant Examiner*—Ernest F. Karlsen
*Attorney, Agent, or Firm*—Hill, Gross, Simpson, Van Santen, Steadman, Chiara & Simpson

[57] ABSTRACT

A digital voltage level measuring device includes an amplifier having a capacitive feedback the output voltage of which is brought to a value dependent upon the integration result reached within a given interval of time of a voltage to be measured. After disconnection of the voltage which is to be measured, the output voltage is fed back to the amplifier input. The interval of time from the beginning of the feedback phase until the reaching of a given voltage value by the exponentially changing output voltage is then digitally measured.

7 Claims, 3 Drawing Figures

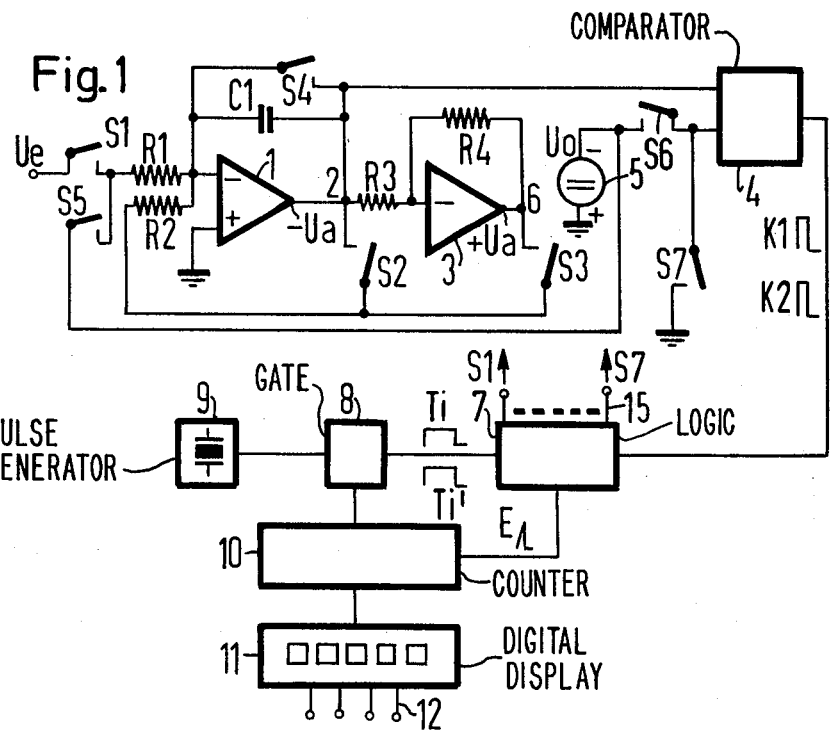
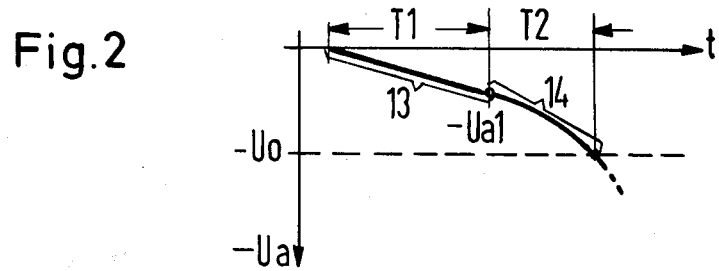
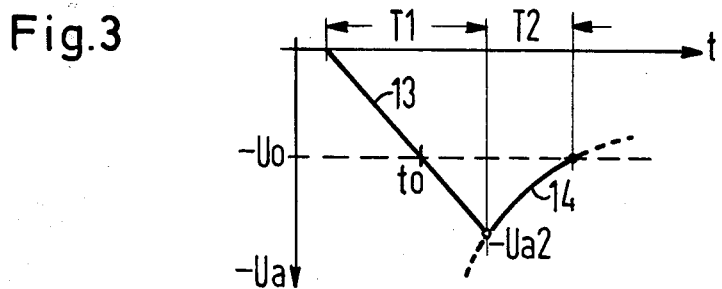

DIGITAL VOLTAGE LEVEL MEASURING DEVICE

BACKGROUND OF THE INVENTION

It is known in voltage level measuring devices such as the British Pat. No. 1,058,942 to bring the output voltage of the amplifier to a value dependent upon the voltage to be measured in a first measuring phase, charging a capacitor connected in series with the amplifier input to this voltage. The stored charge is then, in a second measuring phase, transferred to a feedback capacitor. The feedback phase then follows as a third measuring phase. The analysis is thus based on a highest instantaneous value, occurring during the first measuring phase, of the voltage which is to be measured. This value can, however, be affected by superimposed interference voltage components, causing incorrect voltage measurements.

SUMMARY OF THE INVENTION

The invention employs a voltage measuring device to measure the level of an input voltage which is integrated beforehand over an interval of time, i.e., effect a logarithm evaluation of the ratio of the integrated input voltage to a given reference voltage value. The voltage which is to be measured is connected, via an input switch, during a given interval of time, to the input of an amplifier. The amplifier then serves as an integrator, the output voltage of which represents the integration result achieved over the interval of time. Furthermore, the amplifier serves as the means to effect the logarithmic evaluation of the output voltage representing the integration result, for which purpose the output voltage is fed back to the amplifier input.

The advantage of the invention arises, in particular, in that the integration of the input voltage may be effected using circuit components already required for the logarithm evaluation, i.e. level evaluation, of the input voltage, so any outlay for a special integrator is avoided. Furthermore, the time-based logarithmically-evaluating voltage measuring device in accordance with the invention can, through a slight alteration in its circuit, be used for the integrating measurement of an instantaneous input voltage instead of a time-based input level voltage. In this case the integrating voltage measurement is carried out by principles of double integration.

In accordance with a further embodiment of the invention the output voltage which is to be fed back is fed back with the same polarity as the voltage to be measured when a reference voltage corresponding to the integration result for a reference voltage value of the voltage to be measured is not reached by the output voltage which builds up during the integration process. If the reference voltage is exceeded, the output voltage is fed back with opposite polarity and the time interval until reaching the reference voltage is measured. Thus a logarithm evaluation of the ratio of the integrated input voltage to a reference voltage value for any value of the input voltage is effected automatically and with the correct sign.

BRIEF DESCRIPTION OF THE DRAWINGS

FIG. 1 shows a fundamental circuit diagram of one embodiment.

FIG. 2 shows a voltage-time diagram explaining the mode of operation of the circuit shown in FIG. 1, for a negative value of the input voltage level.

FIG. 3 shows a corresponding diagram for a positive input voltage level value.

DESCRIPTION OF THE PREFERRED EMBODIMENTS

In FIG. 1 the input voltage Ue is conducted via a switch S1 and a resistor R1 to the inverting input of an operation amplifier 1 whose non-inverting input carries earth potential and whose output 2 is connected via a capacitor C1 to the inverting input. C1 is short-circuited whenever a switch S4 is closed. In this circuit the operational amplifier 1 represents an active integrator with C1 as integration capacitance. The output 2 of the integrator is connected via a resistor R3 to the input of a polarity reversal stage 3 which is fed back via a resistor R4. On the other hand the output 2 is connected to the first input of a comparator 4 whose second input is connected via the closed switch S6 to a reference voltage source 5 which produces the reference voltage -Uo.

The inverting input of the operation amplifier 1 can, when it has been freed of Ue, be connected selectively via a switch S2 and a resistor R2 to the output 2 of amplifier 1 or via a switch S3 and the resistor R2 to the output 6 of the polarity reversal stage 3.

The output of the comparator 4 is conducted to a logic circuit 7 which controls a gate circuit 8 by means of its output signals. Here the gate circuit 8 cooperates with a counter pulse generator 9 and a counter 10 in such manner that the counter pulses which occur during the open time of the gate circuit 8 are counted. The counter result may then be represented in digital form in a display device 11 or may be emitted via an output 12 as coded digital signals.

The first phase of a measuring process starts after a preliminary discharge of the integration capacitance C1 by a short closure of the switch S4. After the discharge of C1 the voltage Ue which is to be integrated and analysed in respect of its level in comparison to a given reference value is connected to the inverting input of the operational amplifier 1 by the closure of the switch S1. The upwards integration of Ue which is thereby started, which produces a linear rise in the output voltage -Ua of the integrator 1, is limited to a set time interval T1, upon the expiration of which switch S1 opens again. The output voltage attained at the end of the interval then represents the integration result which is available for further analysis.

In a diagram representing the variation of -Ua over the time t, FIG. 2 shows a linear curve section 13 traced by -Ua during the upwards integration within the time interval T1. Here the integration result —Ua1 does not reach the value of the reference voltage —Uo. FIG. 3 shows on the other hand the case in which the linear upwards integration produces a value —Ua2 which is greater than the reference voltage —Uo. The decision which of the situations | Ua1 | < | Uo | and | Ua2 | > | Uo | exists is made by the comparator 4 which in the latter case emits a first comparator signal K1 at the time "to" (FIG. 3), but not in the former case. The occurrence or absence of the signal K1 during T1 is analysed by the logic circuit 7 such that in a following second measuring phase either the switch S3 is closed and S2 remains open (for the situation of FIG. 2) or S2 is closed and S3 remains open (for the situation of FIG. 3).

In FIG. 2, the second measuring phase commences when the voltage +Ua, which occurs at the output 6 of the reversal stage 3 and which differs from —Ua at the integrator output 2 solely in terms of sign, thus possessing the same polarity as the input voltage Ue, is fed back to the inverting input of the integrator 1 due to the closure of switch S3. Under the influence of this feedback, the output voltage −Ua further approaches the value of the reference voltage −Uo in a second upwards integration, commencing from −Ua1, and reaches said value after an interval of time T2. FIG. 2 shows that the curve section 14 which falls in this time interval T2 possesses an exponential time dependence. The end of time T2 is established by the comparator 4 which upon identity of its input voltages emits a comparator signal K2. Since the logic circuit 7 will emit a gate pulse Ti upon the closure of the switch S3, the pulse Ti lasting until the occurrence of K2, the open time of the gate circuit 8 corresponds to the time interval T2. The count measured in 10 then will correspond to the duration of time T2.

If the reference voltage Uo has been selected to correspond to the integration result for the reference voltage value, the counting result in the counter 10 will also be proportional to the value of the input voltage Ue as integrated over the time interval T1. The level value achieved must be assigned a negative sign which is expediently displayed in the display device 11. The logarithm coding of the measurement result, which is necessary for the desired indication of voltage level is produced from the conversion of the integration result −Ua1 into the time interval T2 which may be digitally measured, with the aid of the exponential curve 14.

If the situation $|Ua| > |Uo|$, illustrated in FIG. 3, exists, the second measuring phase commences upon opening of switch S1 and the closing of switch S2. The voltage −Ua which is tapped at the integrator output 2 and the polarity of which is opposite to that of the input voltage U3, is fed back to the inverting input of 1 by the closure of S2. The polarity reversal at the integrator input in this case leads to a downwards integration as illustrated in FIG. 3 by the curve section 14 with exponential time dependence. The interval of time in which the output voltage −Ua, commencing from the value −Ua2 finally reaches the value of the reference voltage −Uo is again referred to as T2. This interval T2 is bounded by the occurrence of the comparator signal K2 and is analysed in the above-described manner which the aid of the gate 8 and counter 10. The counter result obtained, which is again proportional to the input level related to the given reference voltage value, must in this case be assigned a positive sign which is preferably also displayed in the display device 11.

The counter 10 may conveniently also be used as a timer which establishes or controls the time interval T1 for the upwards integration of Ue. For this purpose the logic circuit 7 may emit, simultaneously to the switching command for the closure of S1, a gate pulse T1' which opens the gate circuit 8 and which triggers a counting process in the counter 10. When a given count has been reached, the counter 10 emits a signal E which in the logic circuit 7 triggers a switching command for the opening of the switch S1.

The logic circuit 7 can particularly advantageously be designed as an automatic flow control unit which by its switching commands emitted via the outputs 15 to the individual switches S1 to S4 establishes a switching sequence which first instigates the discharge of the integration capacitance C1, then the connection of the input voltage Ue during the given time interval T1 and finally, after the latter's disconnection, the switching through of +Ua via switch S3 or of −Ua via switch S2 and the simultaneous actuation of the counter 10 by the opening of the gate circuit 8. This switching sequence can also be repeated for the purpose of constant integrating measurements of the input voltage level. Here it is particularly advisable to design the switches S1 to S4 as electronic switches.

In accordance with a further embodiment of the invention the measuring circuit can readily be modified to be used for an integrating measurement of an instantaneous input voltage instead of a time-based input voltage level. For this purpose the reference voltage Uo is disconnected from the input of the comparator 4 by opening the switch S6 and connected to the integrator input by closing a switch S5. Exponential feed back from the integrator output is avoided by opening the switches S2 and S3. The reference voltage Uo is thus conducted in the second measuring phase to the inverting input of the integrator 1. The second input of the comparator 4, now freed of reference voltage Uo, is supplied with earth potential via a switch S7 which is closed when the switch S6 is opened. The connection of voltage Uo to the integrator input produces a downwards integration until earth potential is reached by the output voltage −Ua of the integrator 1, i.e., when a comparator signal K2 occurs. The interval of time from the closure of the switch S5 until the occurrence of K2 then represents a gauge for the input voltage Ue. That time interval is analysed by the circuit components 8, 9, 10, and 11 in the same manner as described above. The functions of the switches S5 to S7 and the switch-over from level measurement to voltage measurement, and vice versa, can be controlled automatically by the output signals of the logic circuit 7, which may be tapped at 15, or in accordance with a selected program. The switches S5 to S7 are also preferably in the form of electronic switches.

The measuring circuit in accordance with the invention may be used with advantage for monitoring the noise level of a communication system or the parts thereof. For this use the voltage measurement embodiment of the invention is of particular interest.

Although various minor modifications might be suggested by those versed in the art, it should be understood that I wish to embody within the scope of the patent warranted hereon all such modifications as reasonably and properly come within the scope of my contribution to the art.

I claim as my invention:

1. A digitally and logarithmically evaluating voltage measuring device comprising:
   a. an integrating amplifier having an input for a voltage to be measured logarithmically and a capacitor connected between said input and an output thereof to provide a linear integrating feed back;
   b. a first switch to connect and disconnect the voltage to be measured to and from the integrating amplifier input for a given first period of time, whereby an output voltage of said integrating amplifier represents the integration result achieved upon the expiration of said first period of time;
   c. connection means by which the amplifier output voltage is fed back to the amplifier input during an exponential feed back phase which follows the said first period of time;
   d. digital measuring means whereby a second interval of time from the beginning of the exponential feed back phase until the reaching of a reference voltage by the output voltage altering within said exponential feed back phase is digitally measured; and
e. means for feeding back the output voltage to the integrating amplifier input with the same polarity as the input voltage when said output voltage, which increases in absolute value during the given first period of time, does not reach said reference voltage value and for feeding back the output voltage with a polarity opposite to that of the input voltage when the reference voltage is exceeded in absolute value by the output voltage.

2. A voltage measuring device as defined in claim 1, further comprising:
a polarity reversal stage and a comparator which is connected by a first input to said reference voltage, each of said polarity reversal stage and a second input of said comparator connecting to said amplifier output,
the comparator emitting a signal upon the integrator output voltage reaching the reference voltage;
second and third switches to effect said connection of the output voltage to the amplifier input,
the second switch closing at the end of said first time period in the absence of a signal by said comparator during said first time interval, to connect a polarity reversal stage output to the amplifier input through a resistor, and
the third switch closing at the end of said first time period after occurrence of said signal to connect the amplifier output to said amplifier input through said resistor; and
a gate means which triggers said digital time measuring means into operation from the time of the switching of one of said second and third switches until the occurrence of a comparator signal during the exponential feed back phase during the second time interval.

3. A voltage measuring device as defined in claim 2, wherein the first time interval is established by said digital time measuring device.

4. A voltage measuring device as defined in claim 1, further comprising automatic flow control means controlling:
the first switch, to connect the input voltage for the duration of the first time interval;
the second and third switches, to connect one of the polarity reversal output and the amplifier output as a feed back voltage to the amplifier input; and
actuation of the digital time measuring device.

5. A voltage measuring device as defined in claim 1, further comprising switching means affording an optional integrating measurement of an input voltage instead of an input voltage level, said switching means comprising:
a first switch means for disconnecting said reference voltage from the first input of the comparator;
second switch means for connecting said reference voltage to the integrator input; and
third switch means connecting said first comparator input to earth potential,
whereby for said optional integrating measurement the second and third switches both remain open for said voltage measurement.

6. A voltage measuring device as defined in claim 2, wherein all of said switches and gates are electronic.

7. A voltage measuring device as defined in claim 5, wherein all of said switches, gates, and switch means are electronic.

* * * * *